US011803216B2

(12) United States Patent
Leigh et al.

(10) Patent No.: US 11,803,216 B2
(45) Date of Patent: Oct. 31, 2023

(54) CONTIGUOUS PLANE INFRASTRUCTURE FOR COMPUTING SYSTEMS

(71) Applicant: HEWLETT PACKARD ENTERPRISE DEVELOPMENT LP, Houston, TX (US)

(72) Inventors: Kevin B. Leigh, Houston, TX (US); Harvey J. Lunsman, Chippewa Falls, WI (US); John R. Grady, Cypress, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 234 days.

(21) Appl. No.: 17/166,595

(22) Filed: Feb. 3, 2021

(65) Prior Publication Data
US 2022/0244762 A1 Aug. 4, 2022

(51) Int. Cl.
*H05K 7/20* (2006.01)
*G06F 1/18* (2006.01)
*G06F 1/20* (2006.01)

(52) U.S. Cl.
CPC .......... *G06F 1/20* (2013.01); *G06F 1/181* (2013.01); *G06F 1/183* (2013.01); *G06F 1/189* (2013.01); *H05K 7/20781* (2013.01); *G06F 2200/201* (2013.01)

(58) Field of Classification Search
CPC ...................................................... H05K 7/00
See application file for complete search history.

(56) References Cited

U.S. PATENT DOCUMENTS

| | | | |
|---|---|---|---|
| 5,467,609 A | 11/1995 | Feeney | |
| 2003/0125834 A1 | 7/2003 | Campbell et al. | |
| 2014/0124164 A1* | 5/2014 | Campbell | H05K 7/2039 165/45 |
| 2017/0144305 A1 | 5/2017 | Morrill et al. | |
| 2019/0062053 A1 | 2/2019 | Jensen et al. | |
| 2019/0174651 A1* | 6/2019 | Crawford | H05K 7/20836 |
| 2019/0387291 A1* | 12/2019 | Adiletta | G06F 3/0653 |
| 2020/0056392 A1 | 2/2020 | Harinck et al. | |
| 2020/0093026 A1* | 3/2020 | Enright | B25J 9/026 |

OTHER PUBLICATIONS

ESDS.com; "Raised Floors in Data Centers"; Jun. 23, 2010; 7 pages.

* cited by examiner

Primary Examiner — Jerry Wu
(74) Attorney, Agent, or Firm — Nolte Intellectual Property Law Group

(57) ABSTRACT

A computing system includes an array of compute module racks, each compute module rack containing a plurality of compute modules and each compute module being accessible by extracting the compute module rack out of the array of compute module racks. A liquid distribution infrastructure comprising liquid coolant supply lines and return lines is arranged in a first plane adjacent to the array of compute module racks and coupled to each of the vertical racks to provide liquid cooling for the plurality of compute module racks. A power distribution infrastructure comprising power supply lines is arranged in a second plane adjacent to the array of compute module racks and coupled to each of the compute module racks. An optical interconnection infrastructure comprising optical fiber cables is arranged in a third plane adjacent to the array of compute module racks and coupled to each of the compute module racks.

20 Claims, 21 Drawing Sheets

CONTIGUOUS PLANE INFRASTRUCTURE FOR COMPUTING SYSTEMS

BACKGROUND

Computing systems may include a large number of compute modules of various types (processing units, memory units, data routers, switches, and the like) which may be interconnected. Data centers in particular may include many hundreds or thousands of compute modules. Power sources, interconnecting infrastructure, and cooling systems may need to be provided for the compute modules of a computing system.

BRIEF DESCRIPTION OF THE DRAWINGS

The present disclosure is best understood from the following detailed description when read with the accompanying figures, wherein.

Figure 1:
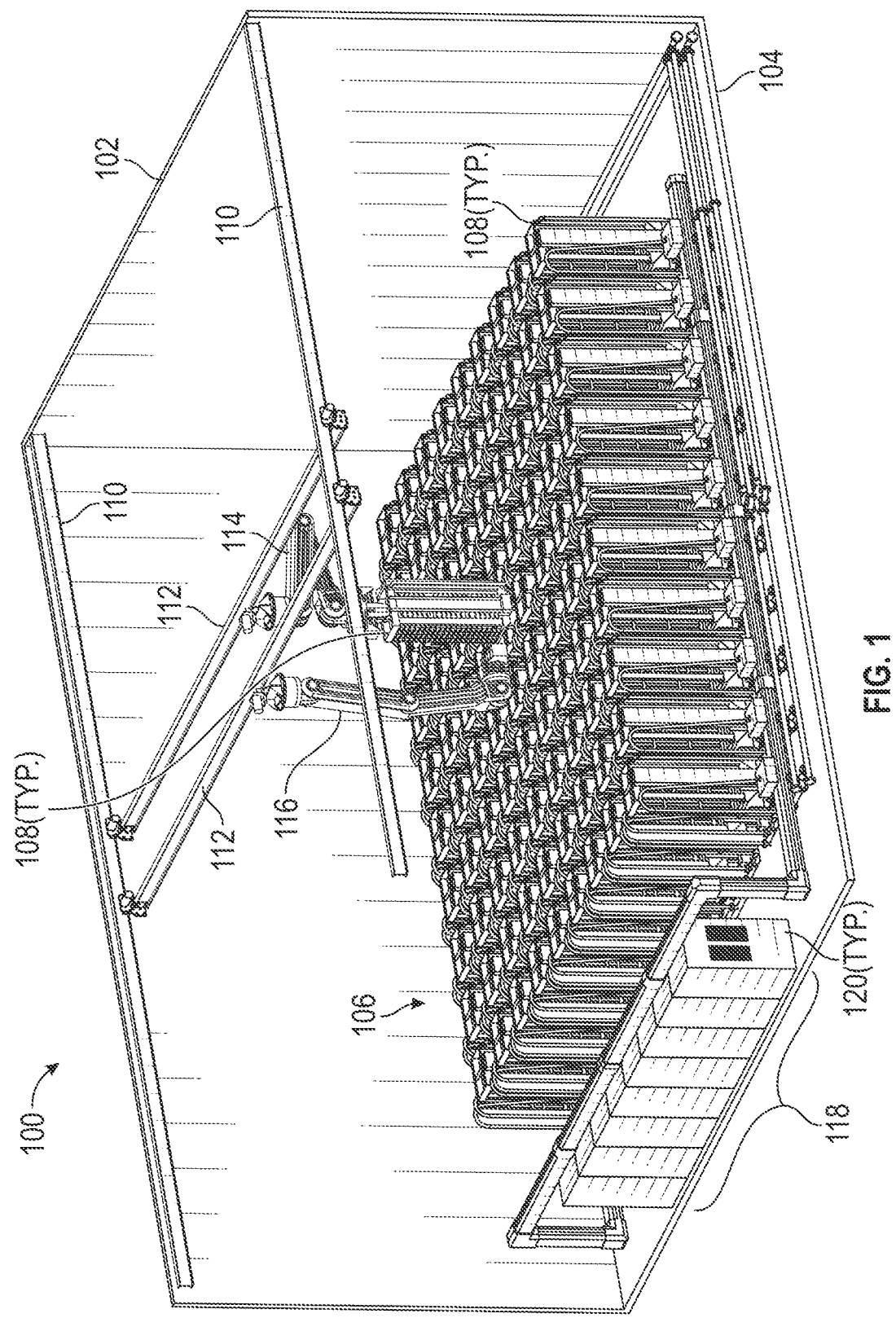
FIG. 1 is an isometric view of a computing system having a contiguous plane infrastructure according to one or more examples.

It is emphasized that, in accordance with the standard practice in the industry, various features are not drawn to scale. In fact, the dimensions of the various features may be arbitrarily increased or reduced for clarity of discussion or illustration.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Further, as used herein, the term "power conductor" is intended to refer to any one or more conductive elements, such as wires, cables, ribbons, electrical traces, and the like, capable of conducting alternating current ("AC") and/or direct current ("DC") voltages from one point to another.

As used herein, to "provide" an item means to have possession of and/or control over the item. This may include, for example, forming (or assembling) some or all of the item from its constituent materials and/or, obtaining possession of and/or control over an already-formed item.

Where repeating structures or elements are shown in the drawings, the designation "(TYP.)" may be used to indicate a "typical" instance of repeating referenced element. This is necessary in order to provide clarity in the drawings.

Examples of computing system infrastructures are described herein which include an array of compute module racks. A liquid distribution infrastructure including liquid supply and return lines is arranged in a first plane adjacent to the array of compute module racks and each compute module rack is coupled to the cooling distribution infrastructure. A power distribution infrastructure comprising power supply lines is arranged in a second plane adjacent to the array of compute module racks and each compute module rack is coupled to the power distribution infrastructure. A data interconnection infrastructure comprising optical fiber cables is arranged in a third plane adjacent to the array of compute module racks, and each compute module rack is coupled to the data interconnection infrastructure. The plurality of compute module bays in a compute module rack in the array of compute module racks may be accessible by extracting the rack out of the array.

In examples herein, compute module racks of compute modules in an array of compute module racks may be coupled to the liquid distribution, power distribution, and data interconnection infrastructure planes either by connections that include service loops allowing for continuous connection when a rack is extracted out of the array, or by blind connections which are disconnected when a compute module rack is extracted out the array.

Although examples herein are described as having individual, contiguous liquid distribution infrastructure planes, power distribution infrastructure planes and optical connectivity infrastructure planes, in some examples one or more features or structures of one infrastructure plane may intersect with or extend through other infrastructure planes, such that all infrastructure planes may be appropriately coupled to the computing system to which they are adjacent.

In some examples, a structure may be provided over gaps between the compute module racks in the array of compute module racks, with the grid structure and the tops of the racks defining a "floor" of a data center. Robotic manipulators may be provided for extracting individual racks out of the array and for installing and removing compute modules from the compute module bays in the racks.

Arrangements of compute module racks in an array having adjacent infrastructure planes as discussed herein allow for greater density in the spacing of compute module racks, since the need for "hot" and "cold" "aisles" separating compute module racks to promote the exchange of ambient air surrounding compute module racks may be reduced or eliminated. Moreover, the contiguous plane infrastructure arrangement may facilitate scaling of computing systems in multiple dimension including size, power, cooling connectivity, and count.

Examples herein relate to configurations of computing systems, and methods of computing systems incorporating a contiguous plane infrastructure for performing power distribution, liquid distribution, and data connectivity functions for an array of compute module racks each containing a plurality of compute modules. Compute module racks may be arranged in a dense array without requiring hot aisle and cool aisle separations. The compute module racks may be extracted from the array for installation and service of compute modules contained therein. The contiguous plane infrastructure may be adjacent to the array of compute module racks, such that each compute module rack may be directly coupled to the liquid distribution, power distribution, and data connectivity resources provided by contiguous liquid distribution, power distribution, and data connectivity infrastructures.

FIG. 1 is an isometric view of an example computing system 100 having a contiguous plane infrastructure according to one or more examples. Computing system 100 includes a walled enclosure 102 (partially cut away in FIG. 1) having a floor 104. An array 106 of compute module racks 108 is contained within walled enclosure 102. In the example of FIG. 1, a beam system including stationary beams 110 and rolling beams 112 support a robotic system including a first robotic manipulator 114 for withdrawing a compute module rack 108 out of array 106, and a second robotic manipulator 116 for accessing compute modules within a compute module rack 108, as hereinafter described in further detail. FIG. 1 further shows a plurality 118 of power supply modules 120 adjacent to array 106 of compute module racks 108.

Figure 2:
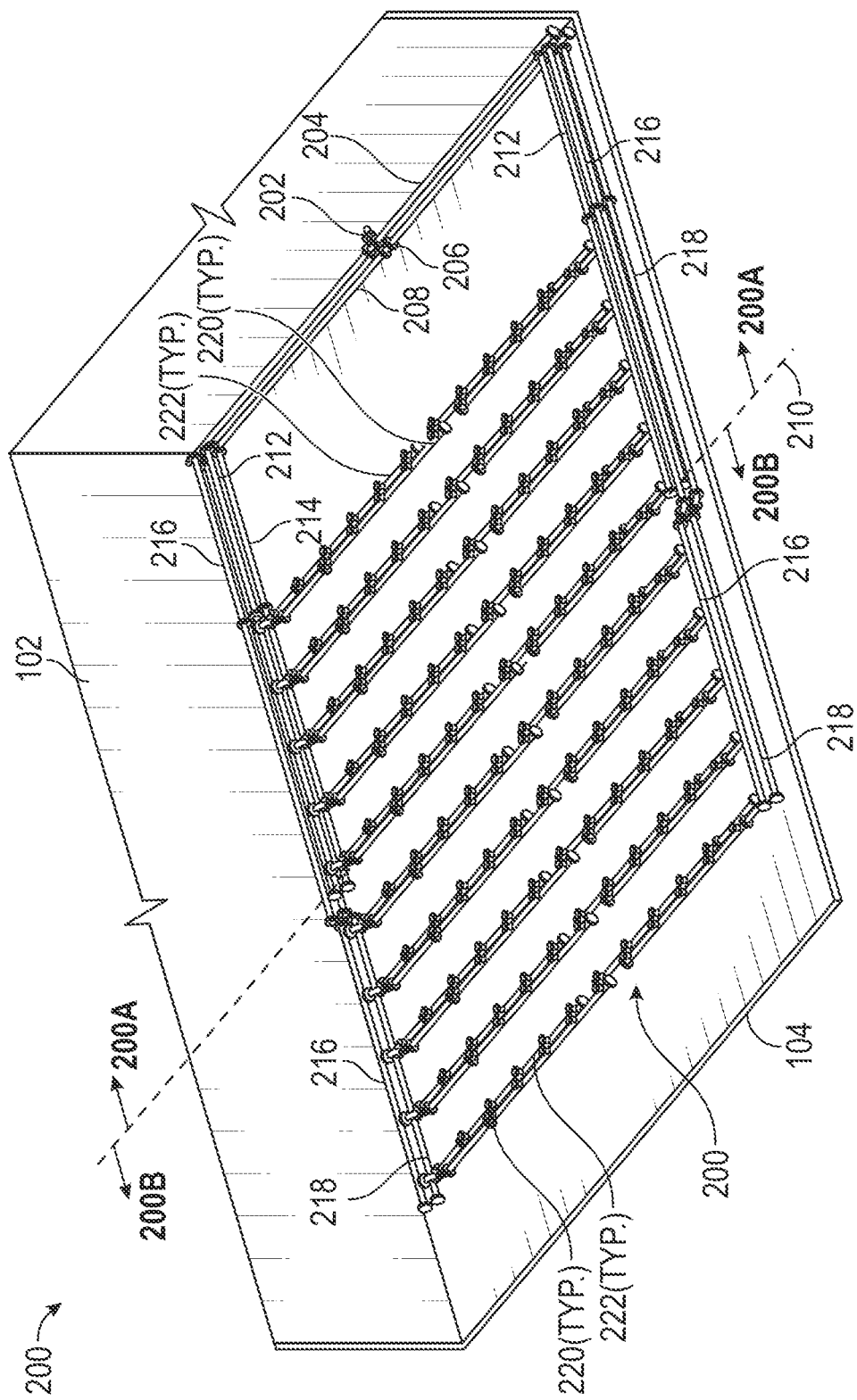
FIG. 2 is an isometric view of a liquid distribution infrastructure in a contiguous plane infrastructure according to one or more examples.
Figure 3:
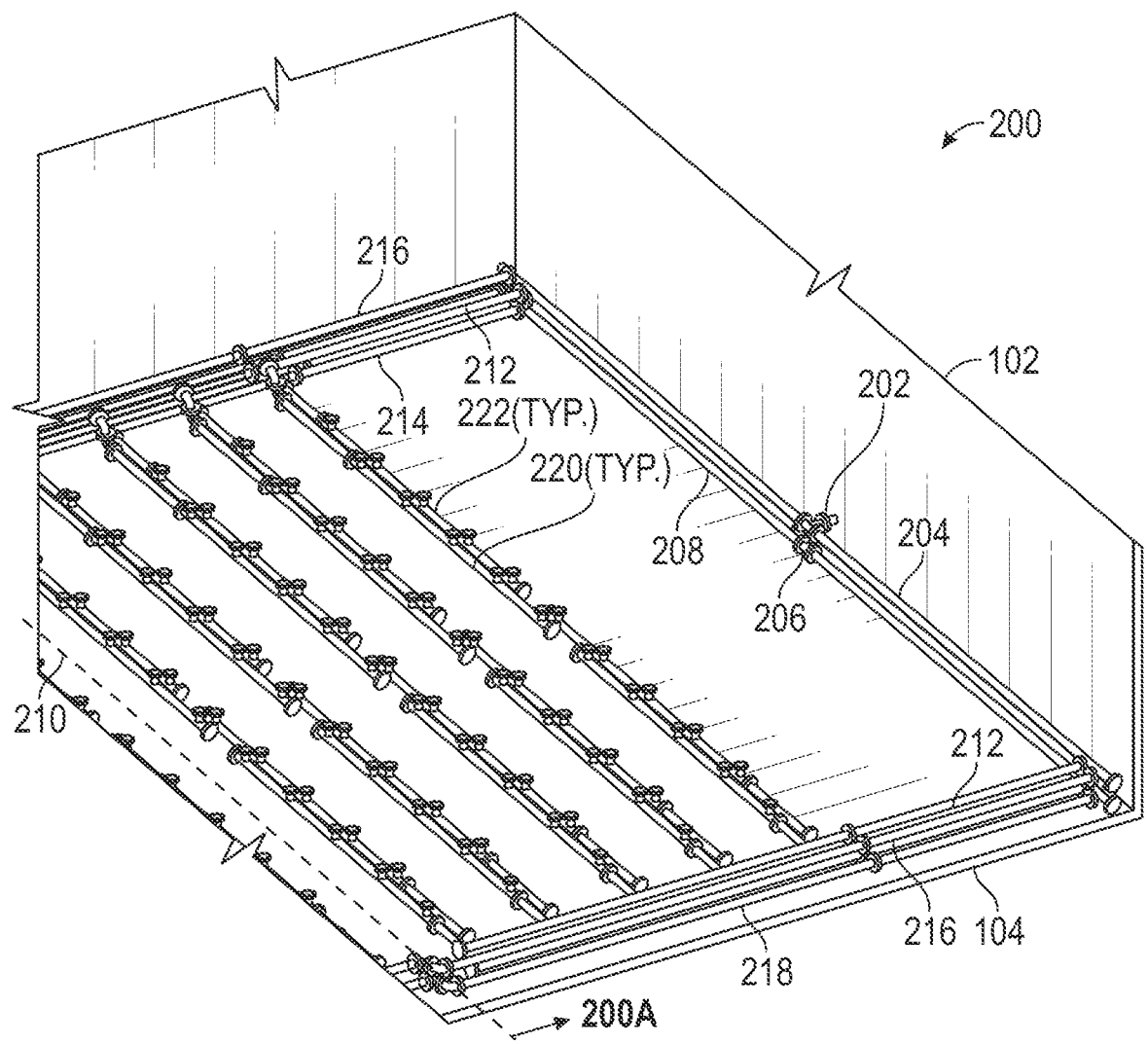
FIG. 3 is an isometric view of a first end portion of the liquid distribution infrastructure from the examples of FIG. 2.
Figure 4:
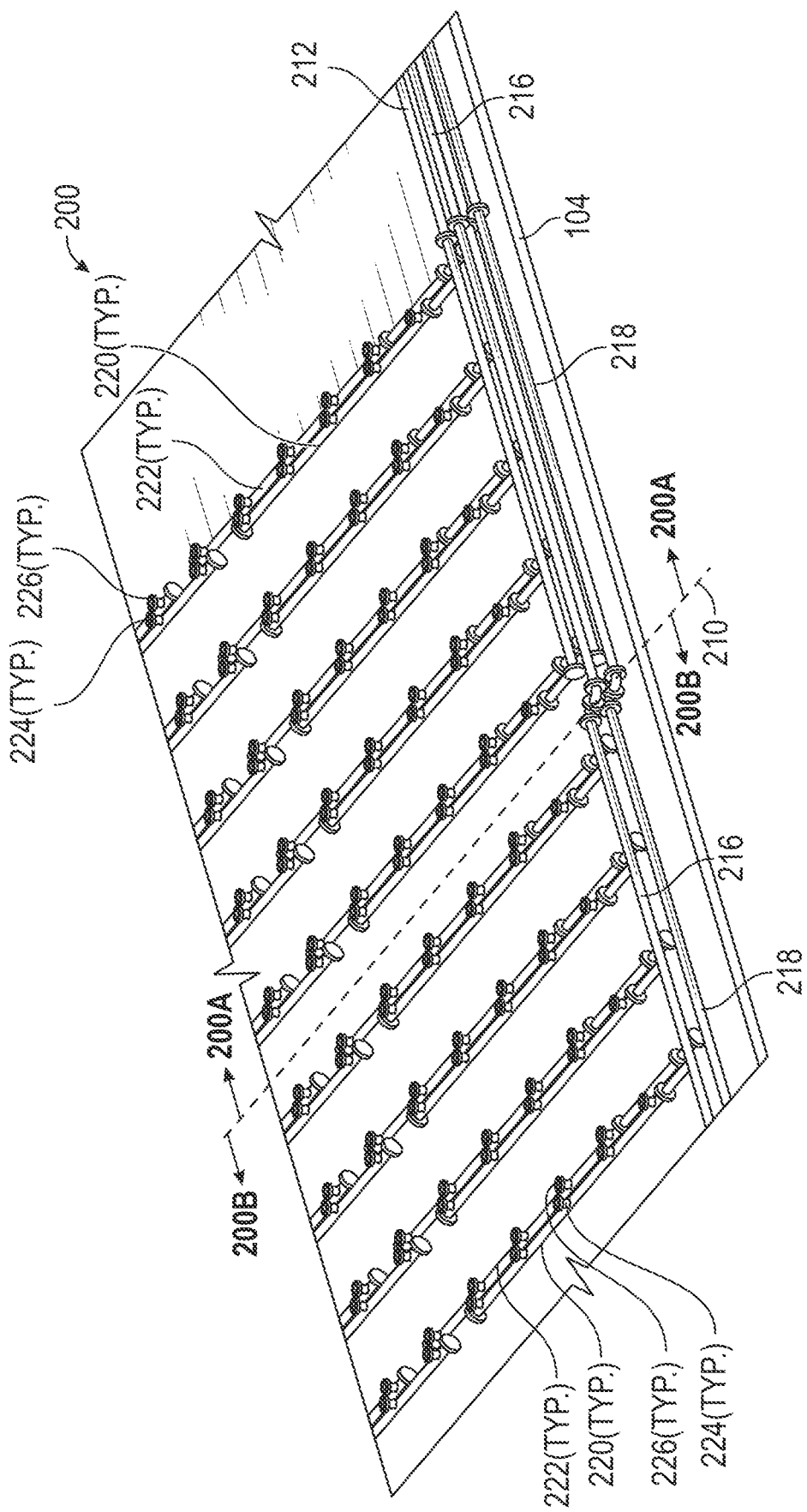
FIG. 4 is an isometric view of a first side portion of the liquid distribution infrastructure from the examples of FIG. 2.
Figure 5:
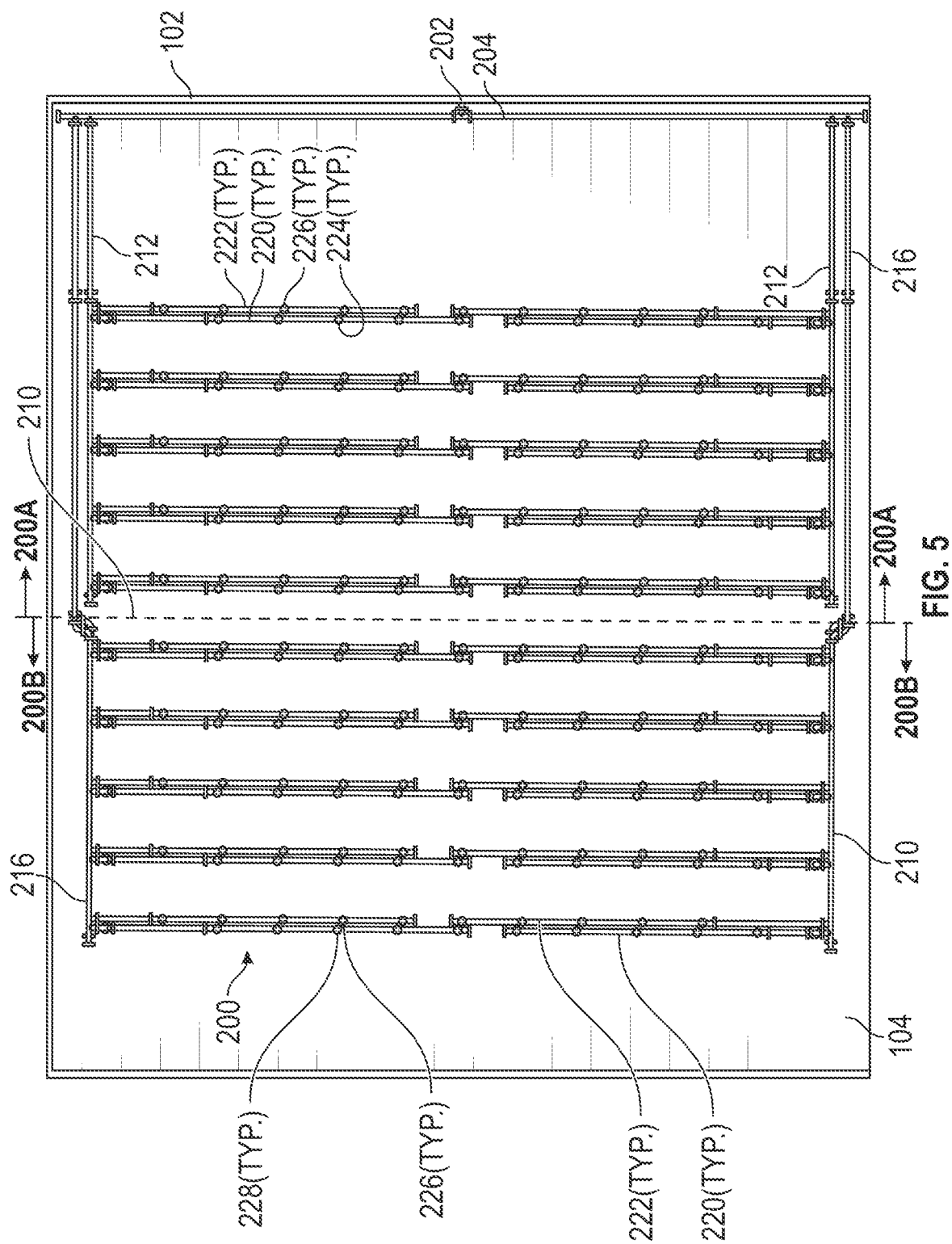
FIG. 5 is a top view of the liquid distribution infrastructure from the example of FIG. 2.

FIGS. 2, 3, 4, and 5 show various views of a liquid distribution infrastructure 200 in a contiguous plane infrastructure according to one or more examples for providing liquid cooling to compute module racks such as the array 106 compute module racks 108 from the example from FIG. 1. In particular, FIG. 2 is an isometric view of liquid distribution infrastructure 200, FIG. 3 is an isometric view of a first end portion of liquid distribution infrastructure 200, FIG. 4 is an isometric view of a first side portion of liquid distribution infrastructure 200, and FIG. 5 is a top view of liquid distribution infrastructure 200.

As shown in FIGS. 2-5, liquid distribution infrastructure 200 is arranged in a plane which may extend beneath array 106 of compute module racks 108 (which for purposes of illustration are not shown in FIGS. 2-5). In various examples, liquid distribution infrastructure 200 may include an arrangement of cooled liquid inflow pipes and heated fluid outflow pipes, as hereinafter described in greater detail. In examples, cooled liquid is introduced into liquid distribution infrastructure 200 through a liquid input connection 202 to a main liquid supply line 204, and heated liquid is return from liquid distribution infrastructure 200 through a liquid output connection 206 from a main liquid return line 208.

In the example of FIGS. 2-5, liquid distribution infrastructure 200 is divided into two separate zones, 200A and 200B; dashed line 210 in FIGS. 2-5 represents the division between zones 200A and 200B. In this example, a pair of liquid supply branch lines 212 from main liquid supply line 204 supplies liquid to first zone 200A of liquid distribution infrastructure 200, and a pair of liquid return branch lines 214 returns liquid from first zone 200A of liquid distribution infrastructure 200 to main liquid return line 208. Further, a pair of liquid supply branch lines 216 from liquid from main liquid supply line 204 supplies liquid to second zone 200B of liquid distribution infrastructure 200, and a pair of liquid return branch lines 218 returns liquid from second zone 200B of liquid distribution infrastructure 200 to main liquid return line 208. Division of liquid distribution infrastructure 200 into multiple zones each having separate supply and return branch lines may increase uniformity in cooling efficiency over a larger area of liquid distribution infrastructure.

With continued reference to FIGS. 2-5, in each zone 200A and 200B of liquid distribution infrastructure 200, a plurality of liquid supply sub-branches 220 each extend perpendicularly in a plane from liquid supply branch lines 216 to supply liquid to compute module racks 108 in the array 106 of compute module racks. Further, a plurality of liquid return sub-branches 222 each extend perpendicularly in the plane from liquid return branch lines 218 to provide a liquid return path from compute module racks 108 in the array 106 of compute module racks. Each liquid supply sub-branch 220 has a plurality of liquid supply taps 224 each for connection to a compute module rack 108, and each liquid return sub-branch 222 has a plurality of liquid return taps 226 each for connection to a compute module rack 108.

In examples, cooling liquid provided to a compute module rack 108 through a liquid supply tap 224 is circulated to absorb heat and thereby provide cooling for internal components of the compute module rack 108. The heated liquid is then discharged to a liquid return sub-branch 222 through a liquid return tap 226. Liquid input connection 202 and liquid output connection 206 may be coupled to a central heat exchange system (not shown) for cooling the heated liquid from compute module racks 108 before recirculating the cooled liquid back to main liquid supply line 204 via liquid input connection 202.

Figure 6:
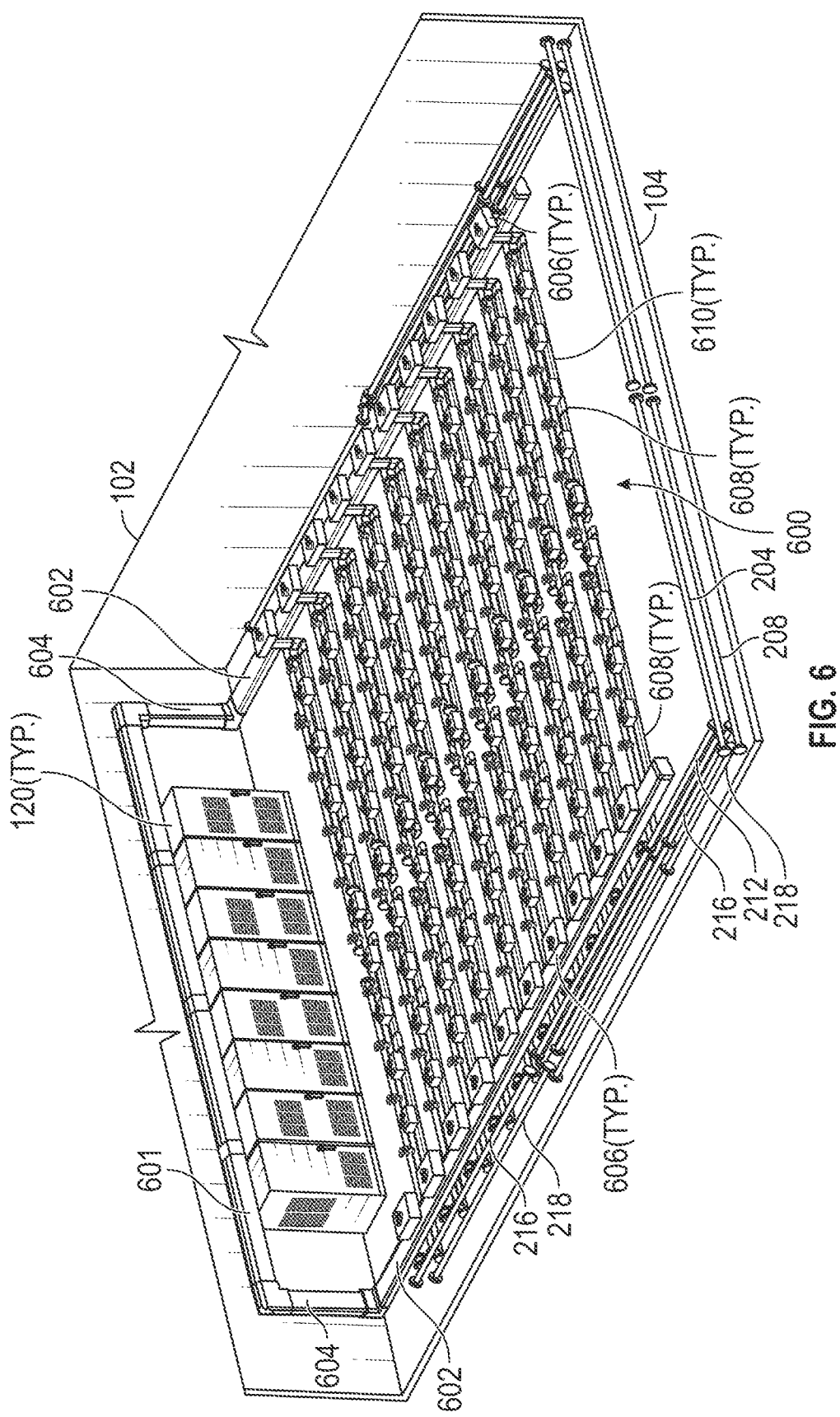
FIG. 6 is an isometric view of a power distribution infrastructure in a contiguous plane infrastructure according to one or more examples, further showing an example liquid distribution infrastructure in the contiguous plane infrastructure in relation to the power distribution system.
Figure 7:
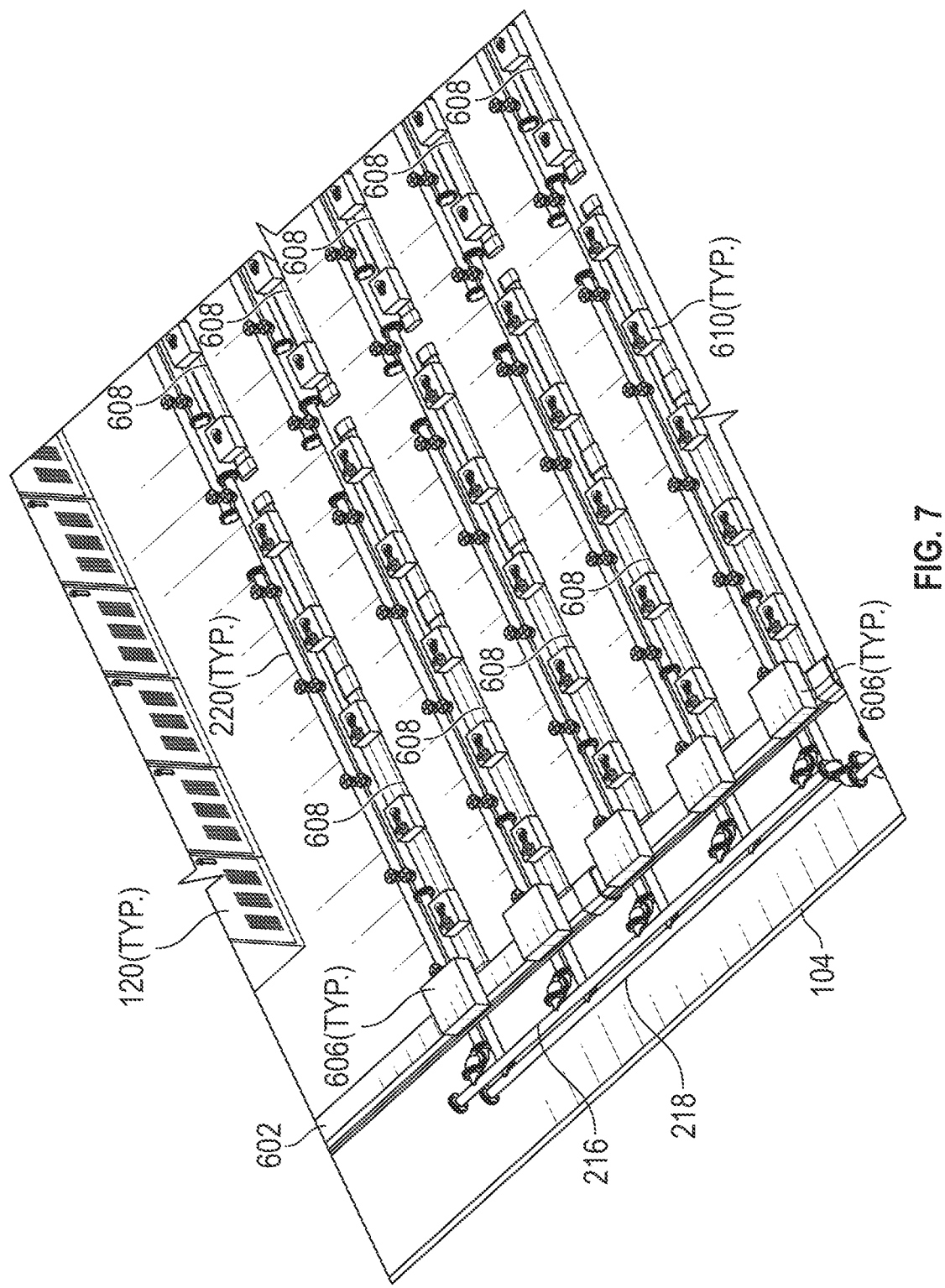
FIG. 7 is an isometric view of a first end of the power distribution infrastructure and liquid distribution infrastructure from the example of FIG. 6.
Figure 8:
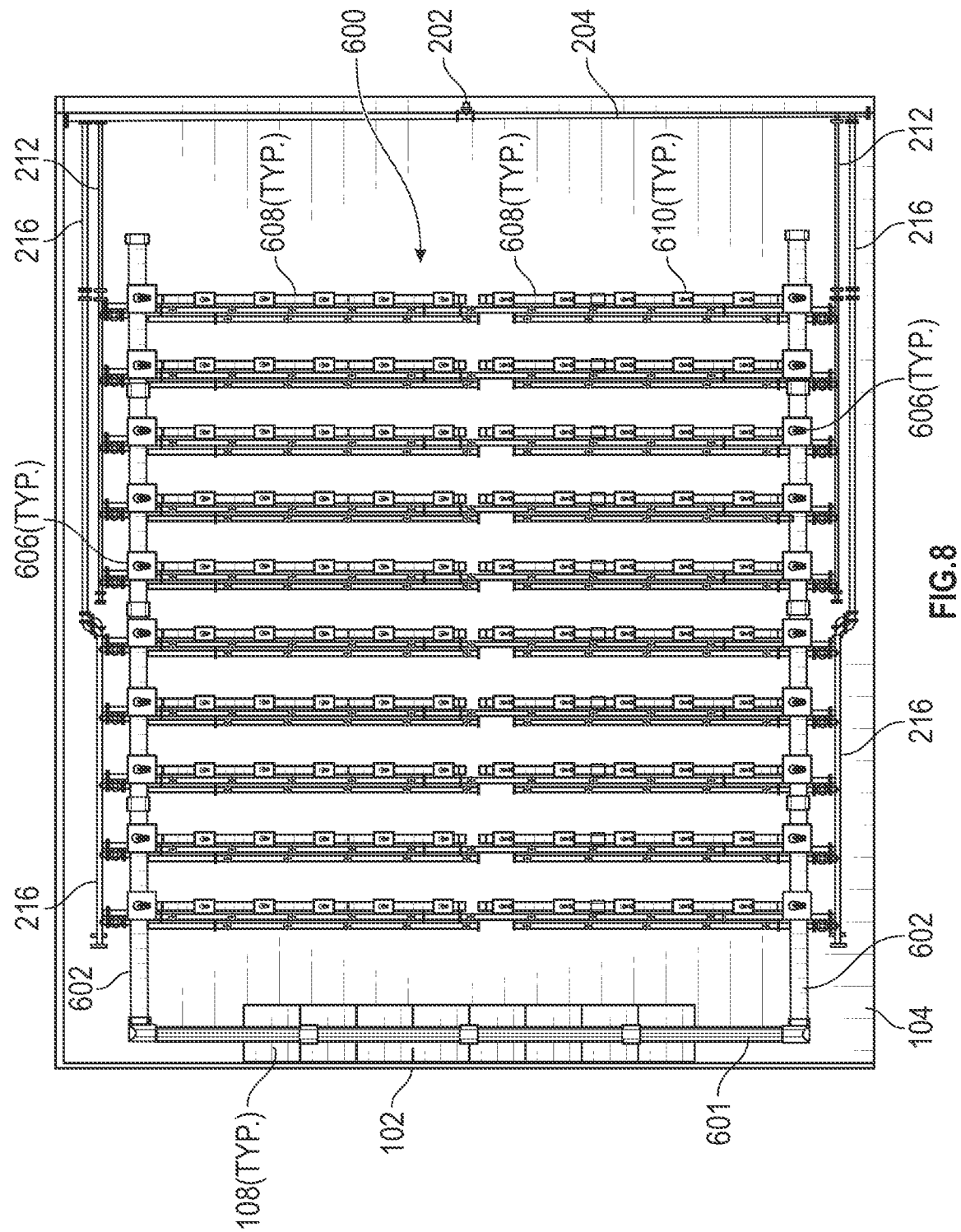
FIG. 8 is a top view of the power distribution infrastructure and liquid distribution infrastructure from the example of FIG. 6.
Figure 9:
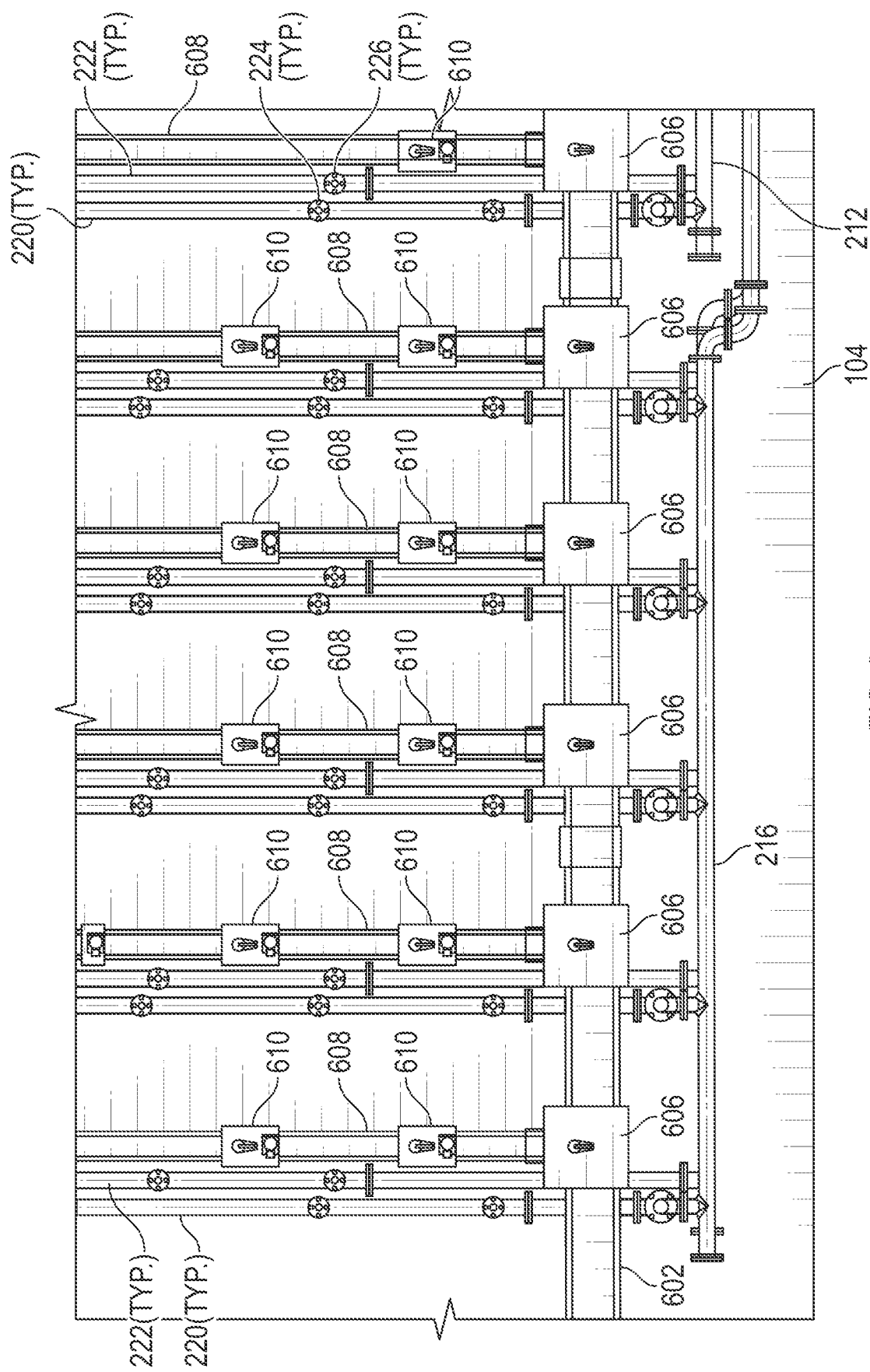
FIG. 9 is a partial top view of the power distribution infrastructure and liquid distribution infrastructure from the example of FIG. 6.

FIGS. 6-9 show various views of a power distribution infrastructure 600 in a contiguous plane infrastructure according to one or more examples for providing power to compute module racks such as the array 106 compute module racks 108 from the example from FIG. 1. In particular, FIG. 6 is an isometric view of a power distribution infrastructure 600 in a contiguous plane infrastructure according to one or more examples, arranged in a contiguous plane with the liquid distribution infrastructure 200 from the example of FIGS. 2-5, FIG. 7 is an isometric view of a first end of the power distribution infrastructure 600 from the example of FIG. 6, FIG. 8 is a top view of the power distribution infrastructure 600 from the examples of FIG. 6, and FIG. 9 is a partial top view of the power distribution infrastructure 600 from the example of FIG. 6.

As shown in FIGS. 6-9, the power distribution infrastructure 600 includes a plurality of power supply modules 120 disposed on floor 104 adjacent to array 106 of compute module racks 108 (not shown in FIGS. 6-9 in the interest of clarity). A power conduit structure includes a central conduit 601 coupled to and extending across power supply modules 120 and coupled to a pair of side power conduits 602 via vertical power connecting conduits 604. Central power conduit 601, side power conduits 602, and vertical power connecting conduits 604 contain power conductors (not shown) for supplying power to array 106 of compute module racks 108 in array 106 of compute module racks.

A plurality of power junction boxes 606 are disposed along the respective lengths of each side power conduit 602 for connecting side power conduits 602 to a plurality of branch power conduits 608 oriented perpendicularly to side power conduits 602 in a plane underneath the area occupied by array 106 of compute module racks 108. Each branch power conduit 608 has a plurality of power connection receptacles 610 disposed thereon for connection to individual compute module racks 108 in array 106 of compute module racks.

Figure 10:
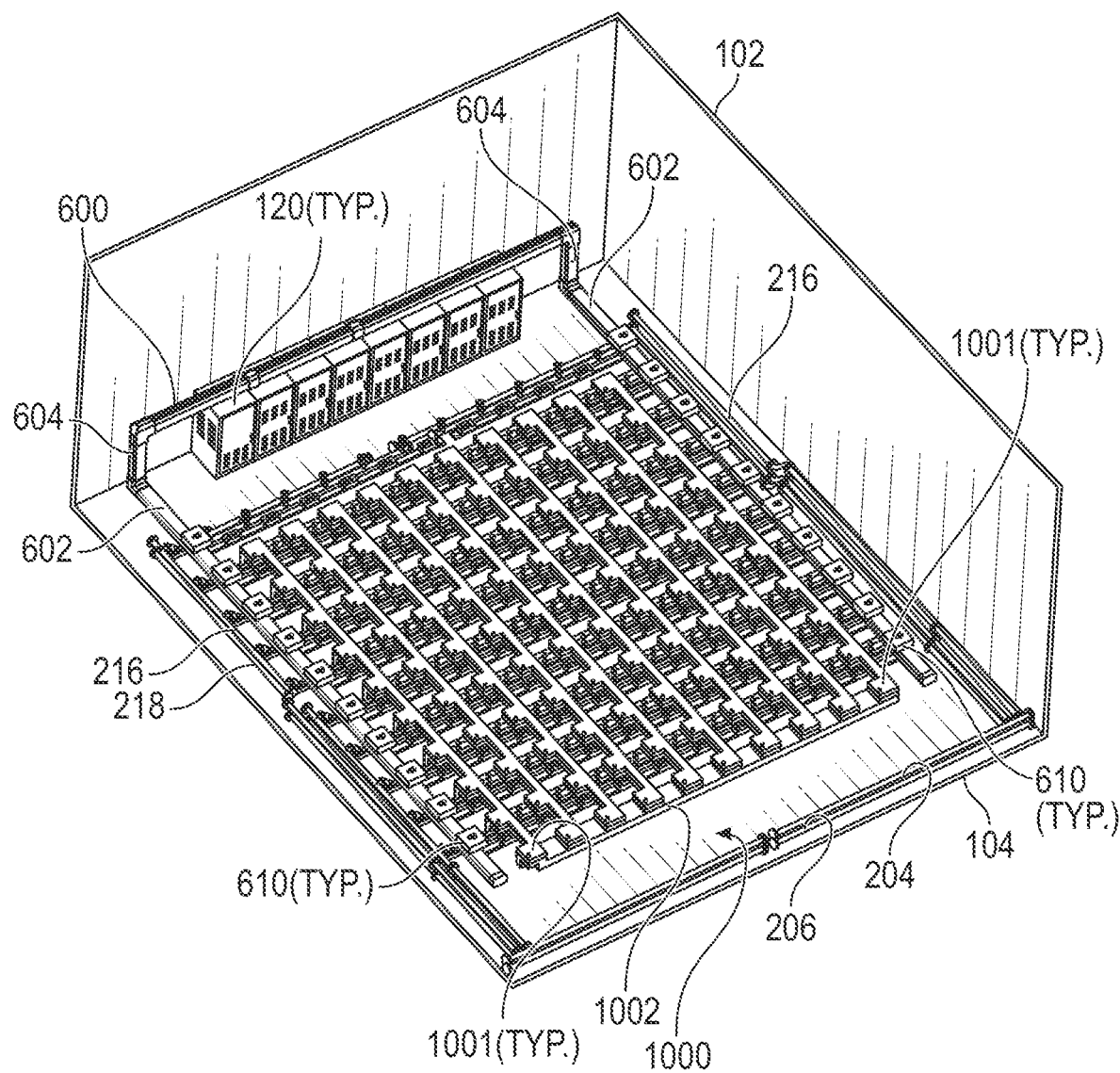
FIG. 10 is an isometric view of an optical connectivity infrastructure in a contiguous plane infrastructure according to one or more examples, further showing a fluid distribution infrastructure and a power distribution infrastructure in the contiguous plane infrastructure in relation to the optical connectivity infrastructure.
Figure 11:
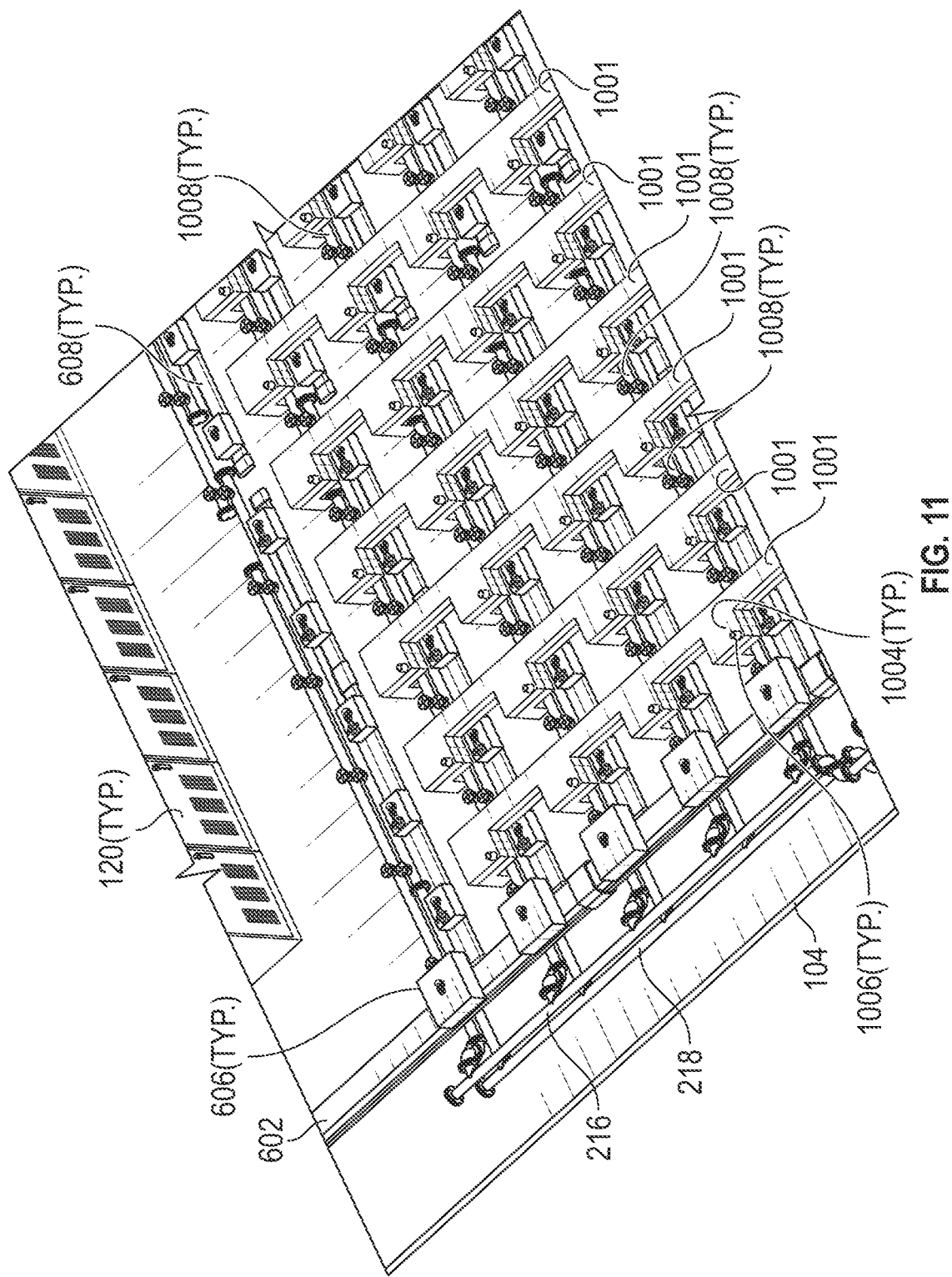
FIG. 11 is an isometric view of a first end of the optical connectivity infrastructure, fluid distribution infrastructure, and power distribution infrastructure from the example of FIG. 10.
Figure 12:
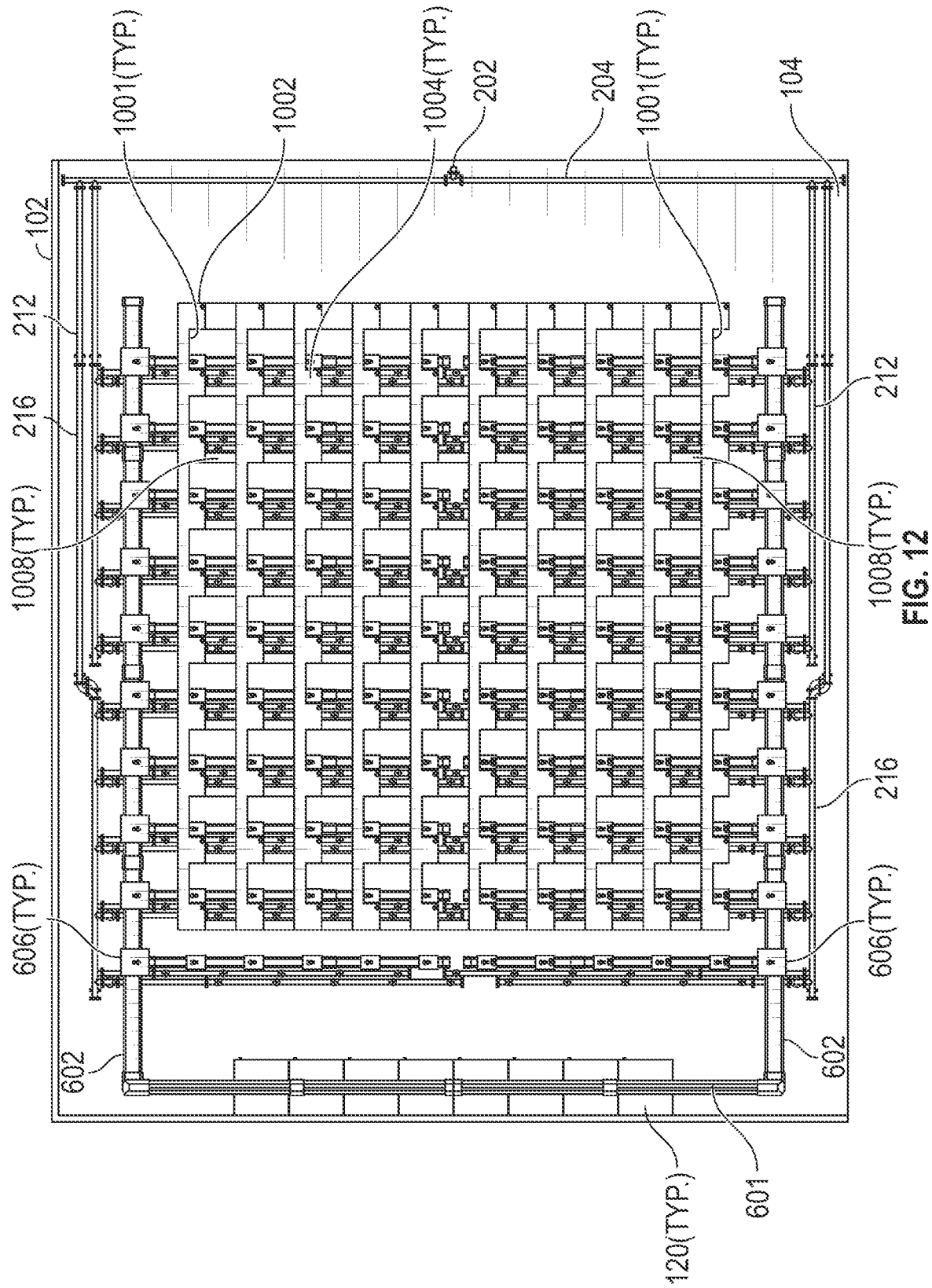
FIG. 12 is a top view of the optical connectivity infrastructure, fluid distribution infrastructure, and power distribution infrastructure from the example of FIG. 10.

FIGS. 10-12 show various views of an optical connectivity infrastructure 1000 in a contiguous plane infrastructure according to one or more examples for providing optical connectivity among compute module racks such as the array 106 compute module racks 108 from the example from FIG. 1. In particular, FIG. 10 is an isometric view of an optical connectivity infrastructure in a contiguous plane infrastructure according to one or more examples, and further showing a fluid distribution infrastructure and a power distribution infrastructure 600 in the contiguous plane infrastructure in relation to the optical connectivity infrastructure, FIG. 11 is an isometric view of a first end of the optical connectivity infrastructure, fluid distribution infrastructure, and power distribution infrastructure 600 from the examples of FIG. 10, and FIG. 12 is a top view of the optical connectivity infrastructure, fluid distribution infrastructure, and power distribution infrastructure 600 from the example of FIG. 10.

In the example of FIGS. 10-12, optical connectivity infrastructure 1000 includes a plurality of optical connectivity branch conduits 1001 extending in a plane adjacent to the array 106 of compute module racks 108 (not shown in FIGS. 10-12 in the interest of clarity). Each optical connectivity branch conduit 1001 connects at one end thereof to a common optical connectivity trunk conduit 1002. Each optical connectivity branch conduit 1001 has a plurality of optical connectivity junction boxes 1004 disposed along its length, with each optical connectivity junction box 1004 having an optical connector receptacle 1006 for connection to a compute module rack 108 in array 106 of compute module racks. Further, each optical connectivity junction box 1004 on an optical connectivity branch conduit 1001 is coupled to an optical connectivity junction box 1004 on an adjacent optical connectivity branch conduit 1001 by an optical connectivity cross-branch conduit 1008. Optical connectivity branch conduits 1001, optical connectivity trunk conduit 1002, and optical connectivity cross-branch conduits 1008 each house one or more optical cables (not shown), enabling compute modules in compute module racks 108 to be selectively interconnected in any desired configuration topology. Each optical cable may comprise plurality of optical fibers and connectors.

Figure 13A:
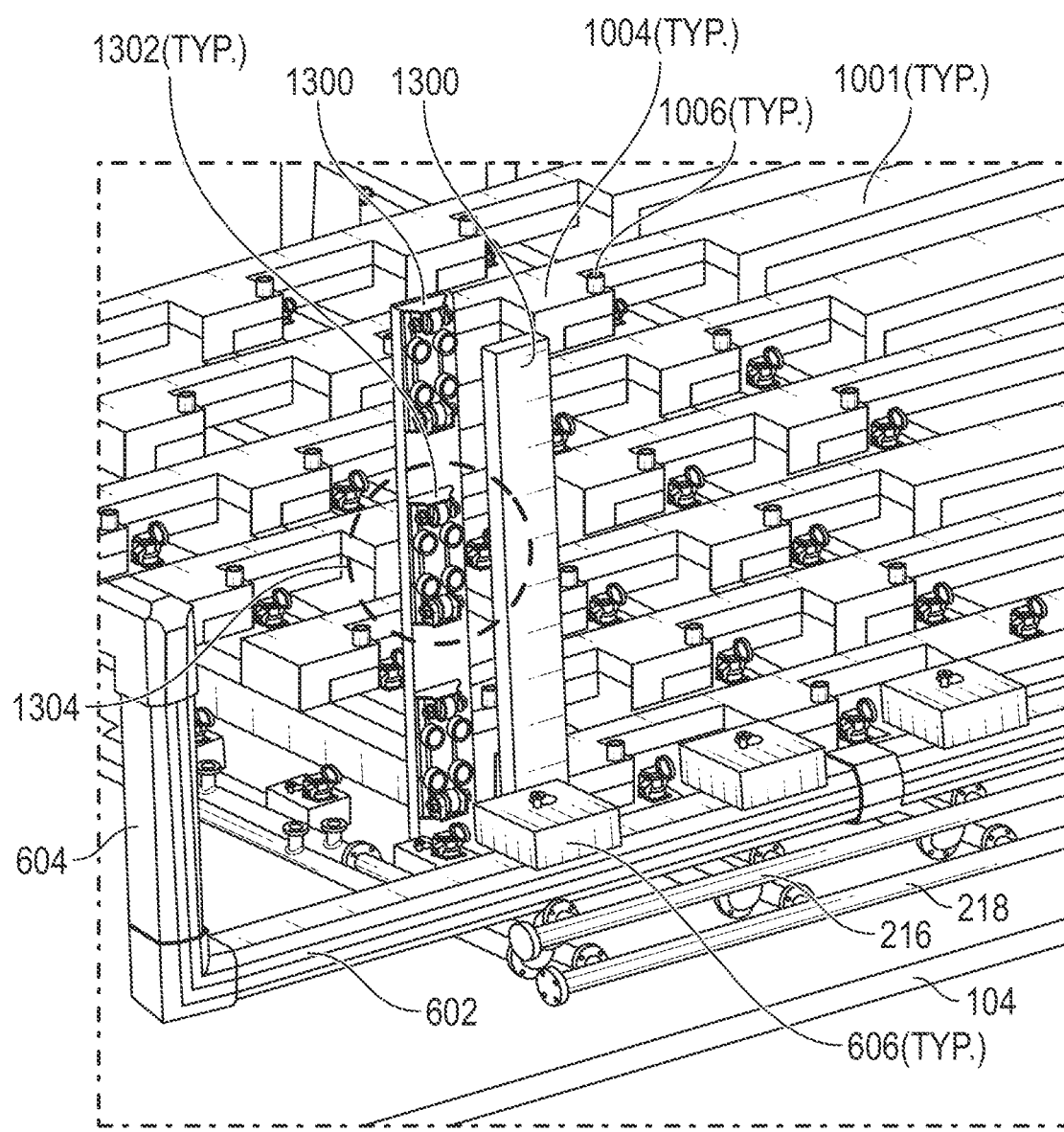
FIG. 13A is an isometric view of a rack mounting system including rack mounting columns with roller assemblies according to one or more examples.

FIG. 13A is an isometric view of a rack mounting system including a pair of rack mounting columns 1300. Each rack mounting column 1300 includes a plurality of roller assemblies 1302, a typical one of which being shown within dashed circle 1304 in FIG. 13A. In FIG. 13A, for clarity only a single pair of rack mounting columns is shown. In various examples, a pair of rack mounting columns 1300 is provided for each compute module rack 108 in the array 106 of compute module racks.

In various examples, each pair of rack mounting columns 1300 functions to support a compute module rack 108 within array 106 of compute module racks, and further functions to facilitate selective extraction of the compute module rack 108 from the array 106 of compute module racks.

Figure 13B:
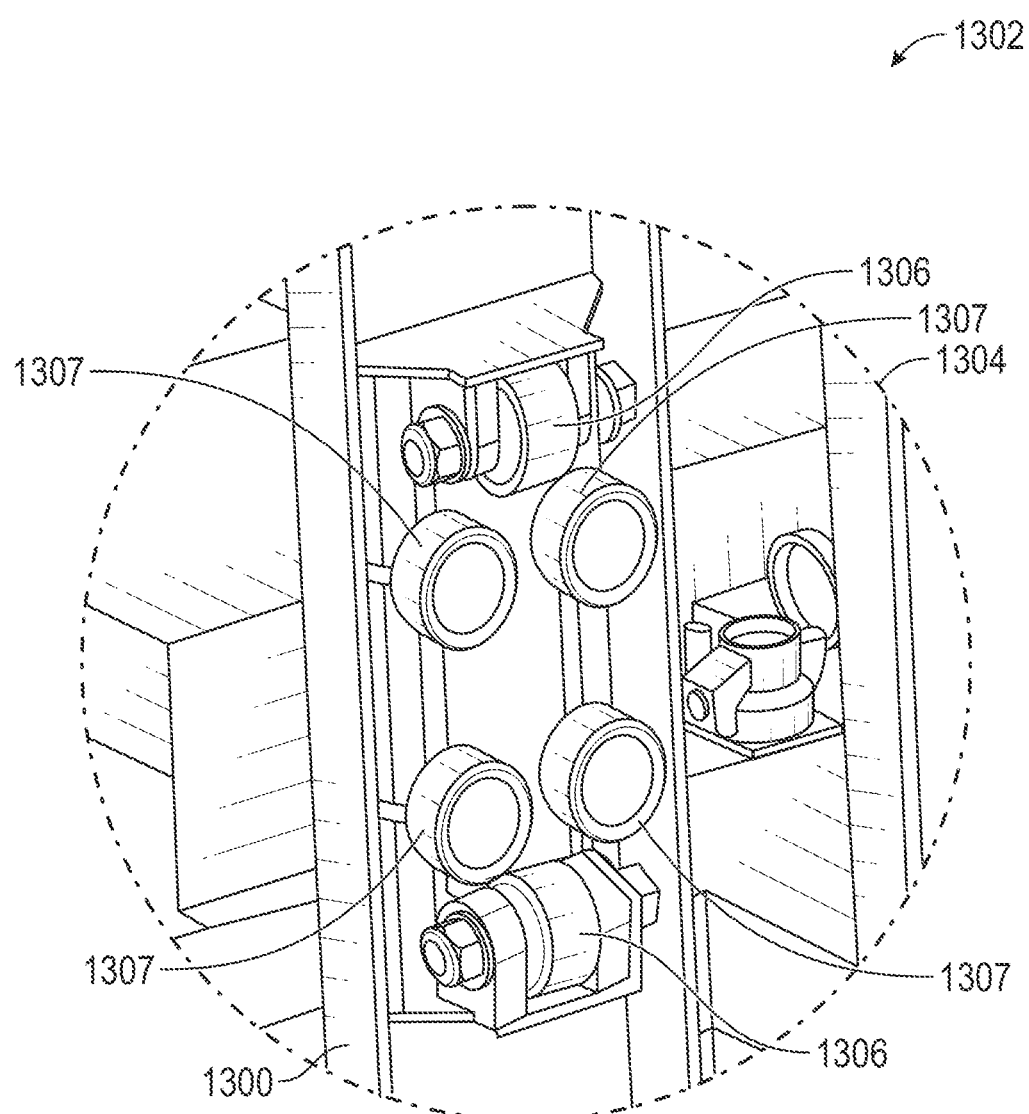
FIG. 13B is an isometric view of a roller assembly from the rack mounting system from the examples of FIG. 13A.

FIG. 13B is an isometric view of a roller assembly 1302 on a rack mounting column 1300 from the rack mounting system of FIG. 13A. As shown in FIG. 13B, each roller assembly 1302 includes a plurality of guide rollers 1306 for side-to-side guidance of a compute module rack 108 (not shown in FIGS. 13A and 13B) and a plurality of guide rollers 1307 for front-to-back guidance of a compute module rack 108, as it is extracted out of array 106 as herein described.

Figure 14:
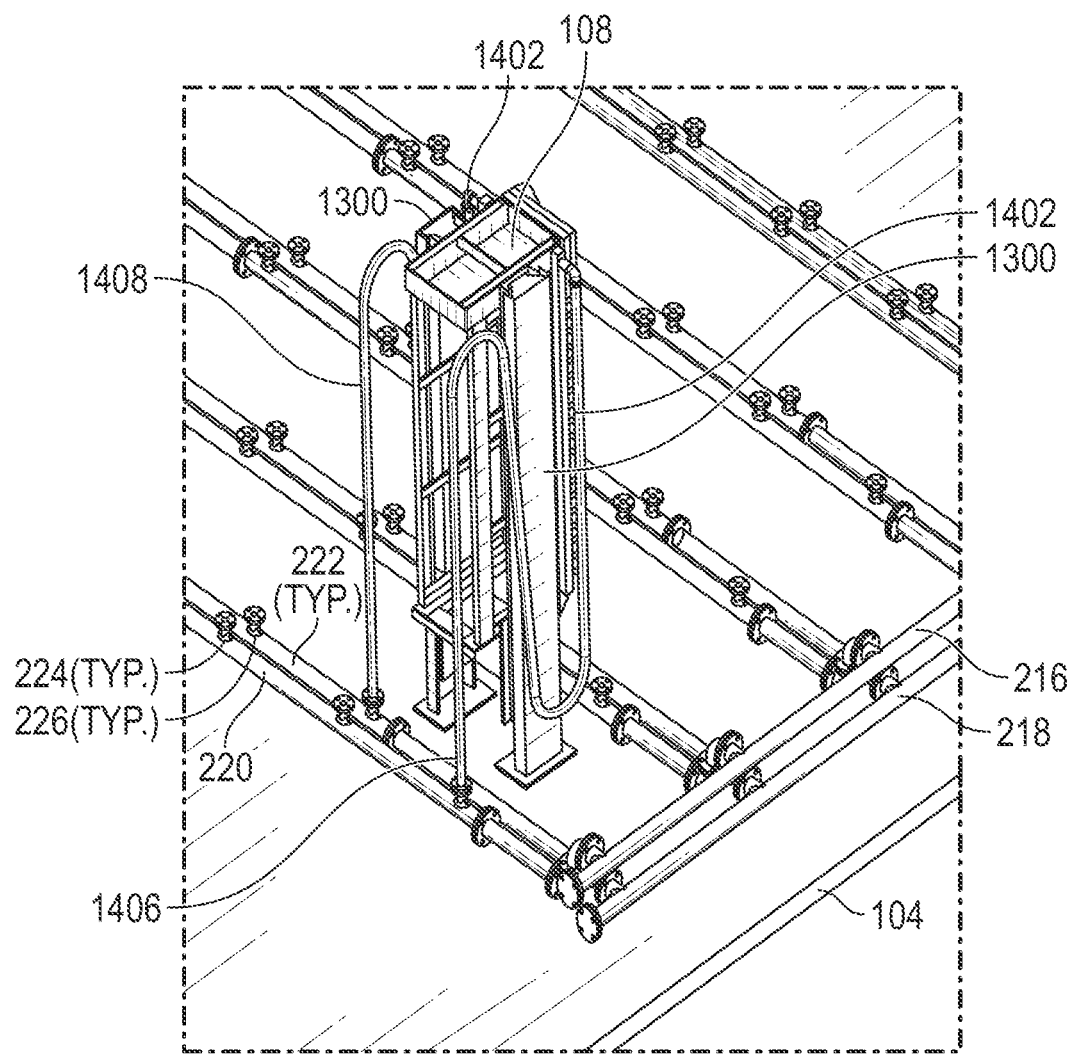
FIG. 14 is a front isometric view of the rack mounting system and liquid manifold with liquid connections to the rack from the examples of FIGS. 13A and 13B.
Figure 15:
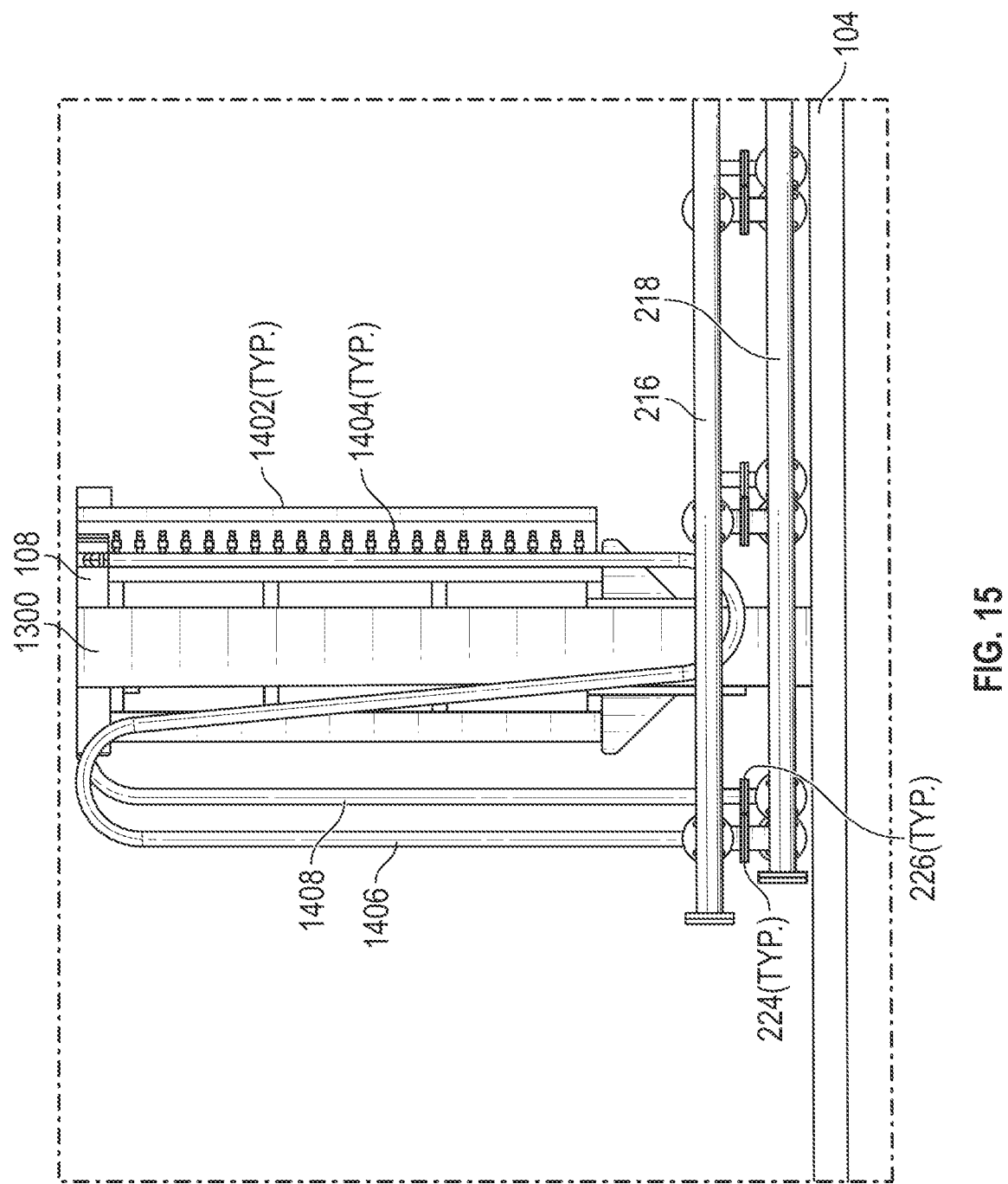
FIG. 15 is a side view of the rack mounting system and liquid manifold with liquid connections to the rack, from the example of FIG. 14.

FIG. 14 is a front isometric view of the rack mounting system from the examples of FIGS. 13A and 13B and further showing a liquid manifold coupled to a liquid distribution infrastructure. FIG. 15 is a side view of the rack mounting system from the examples of FIGS. 13A and 13B and further showing a liquid manifold coupled to a liquid distribution infrastructure. In particular, as shown in FIGS. 14 and 15, a compute module rack 108 is disposed between a pair of rack mounting columns 1300. In FIGS. 14 and 15, a pair of liquid manifolds 1402, each having a plurality of liquid connectors 1404 for connecting to compute modules (not shown) are installed on compute module rack 108. A first liquid manifold 1402 is coupled at a liquid supply tap 224 to a liquid supply sub-branch 220 via a supply liquid service line 1406.

A second liquid manifold 1402 is coupled at a liquid return tap 226 to a liquid return sub-branch 222 via a return liquid service line 1408.

Figure 16:
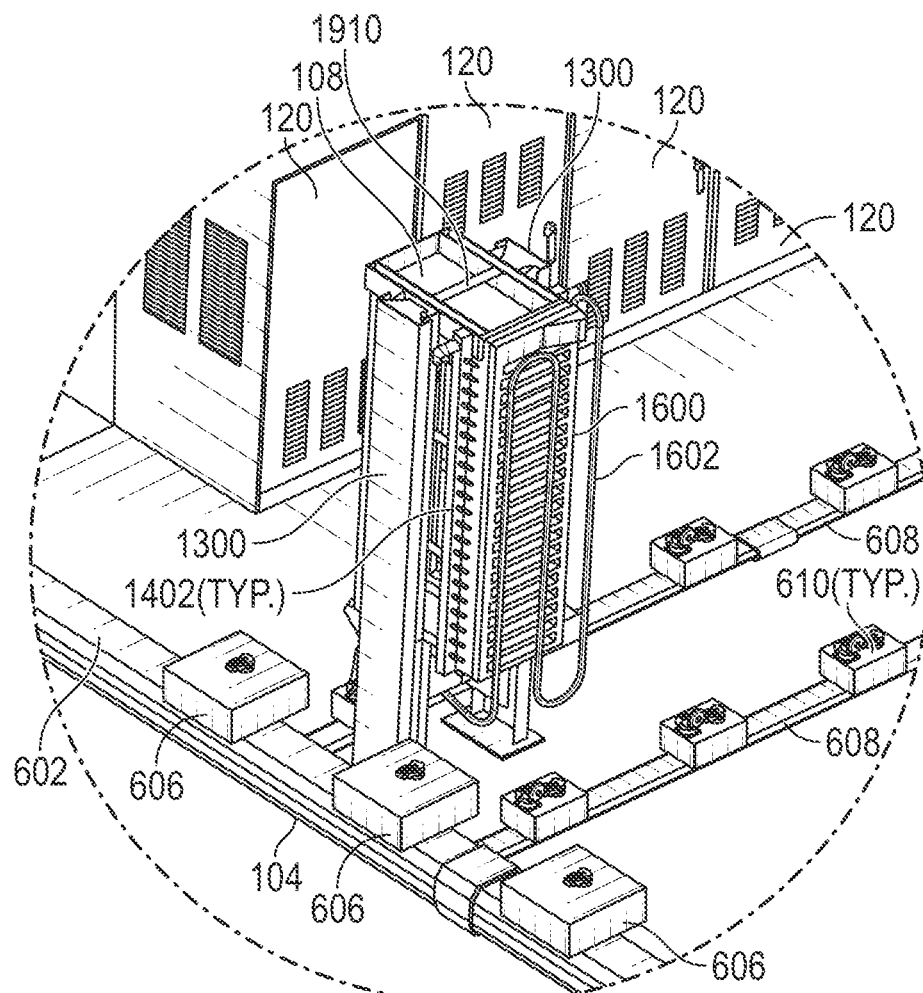
FIG. 16 is a rear isometric view of the rack mounting system and power distribution infrastructure with connections to the rack from the examples of FIGS. 13A and 13B.
Figure 17:
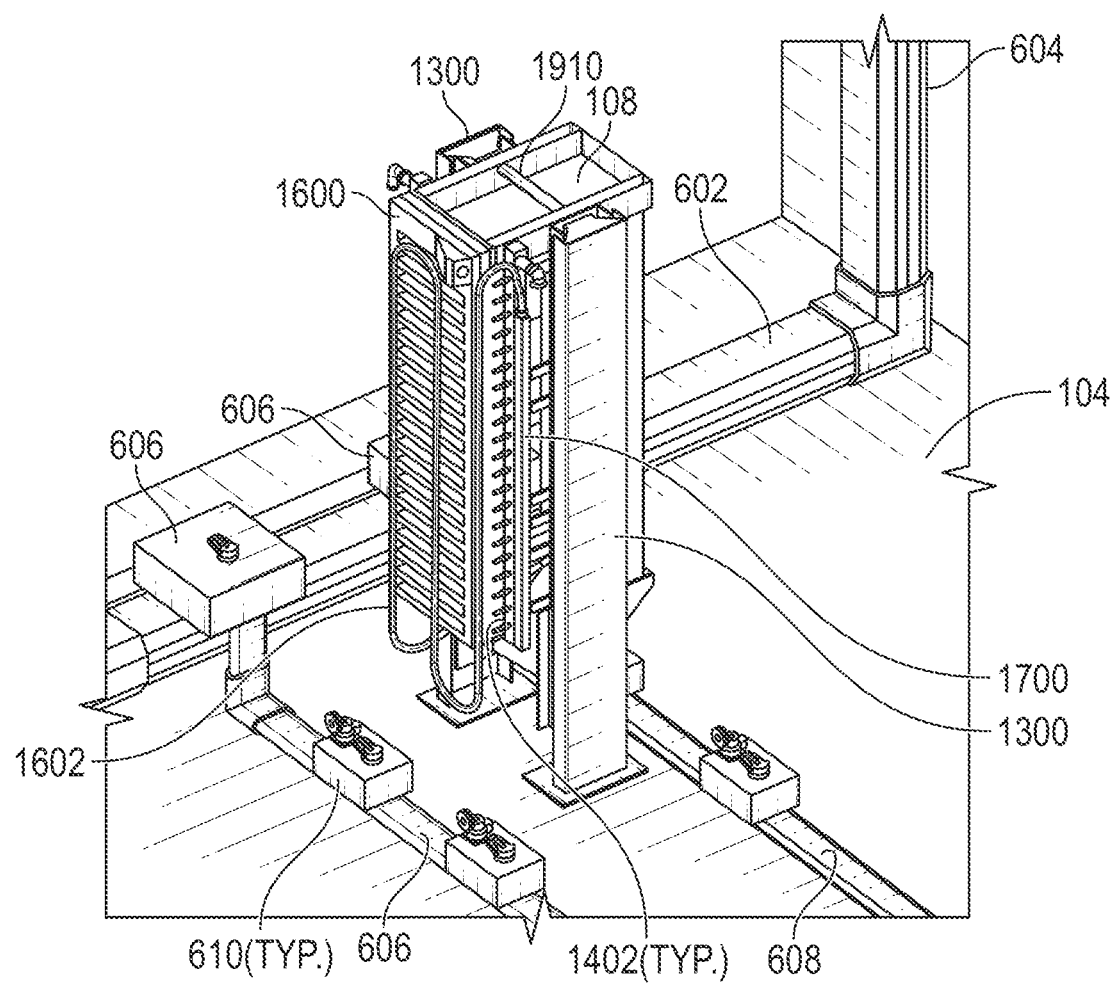
FIG. 17 is a rear isometric view of the rack mounting system and power distribution infrastructure with connections to the rack from the examples of FIGS. 13A and 13B.

FIGS. 16 and 17 are rear isometric views of the rack mounting system from the examples of FIGS. 13A and 13B and further showing a compute module rack 108 having an optical plenum 1600 including optical cables and connectors for providing optical connectivity to compute modules (not shown) installed in compute module rack 108. FIG. 17 further shows a power distribution unit 1700 on one side of optical plenum 1600 for distributing power to compute modules (not shown) installed in compute module rack 108. Power distribution unit is coupled to a power connection receptacle 610 on branch power conduit 608 via a power service line 1602 also shown in FIG. 16.

Figure 18:
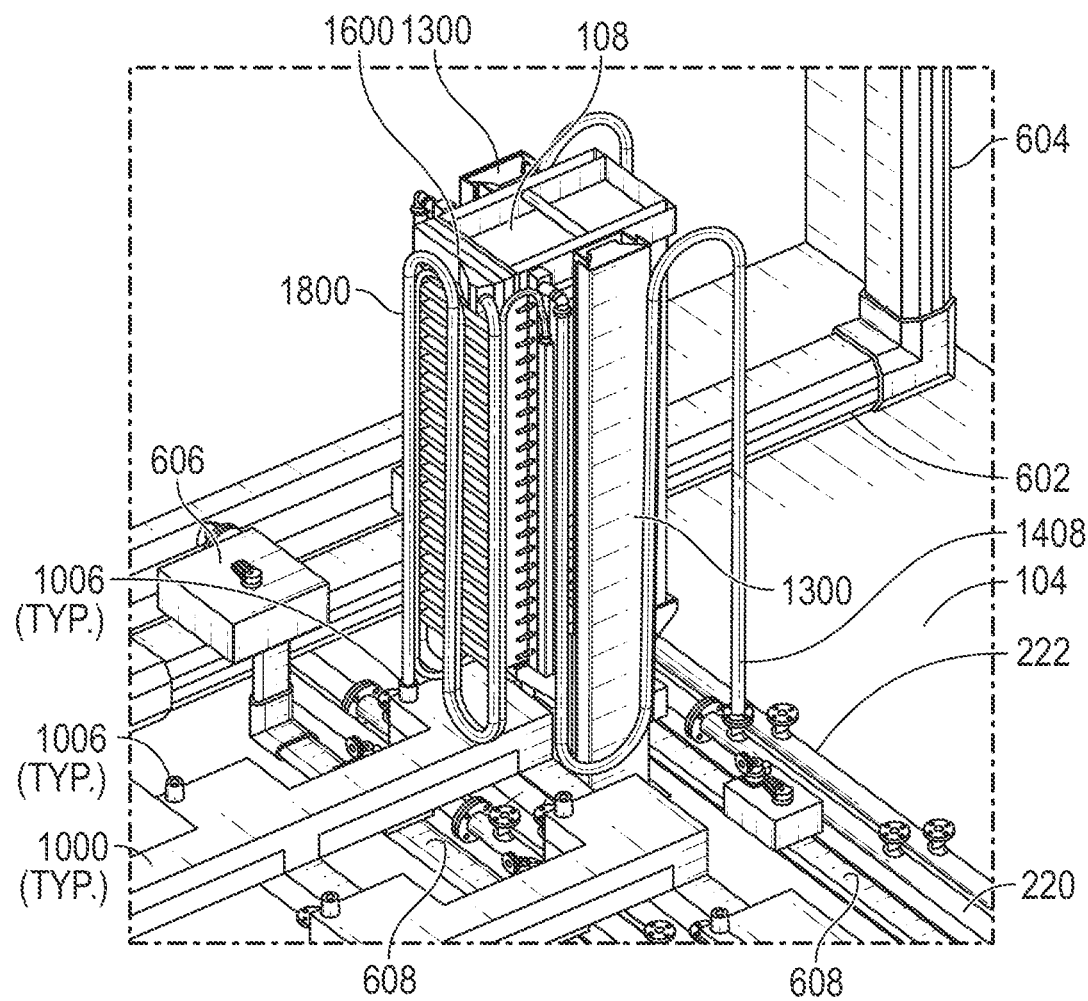
FIG. 18 is a rear isometric view of the rack mounting system and liquid manifold, power distribution infrastructure and optical infrastructure with rack connections from the examples of FIGS. 13A and 13B.

FIG. 18 is a rear isometric view of the rack mounting system from the examples of FIGS. 13A and 13B showing an optical connectivity service line 1800 coupled to an optical connector receptacle 1006 of an optical connectivity junction box 1004.

Figure 19:
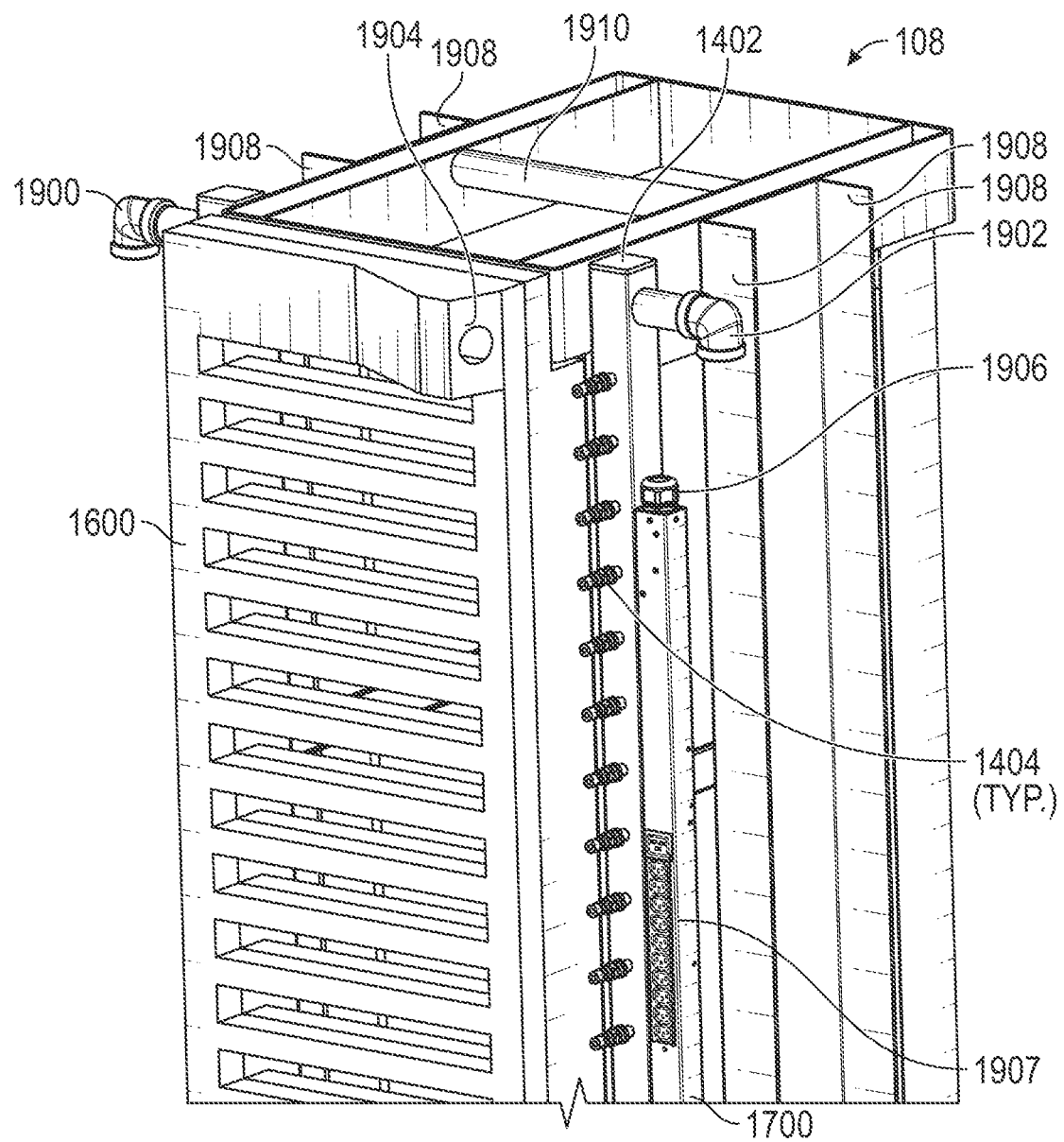
FIG. 19 is an isometric view of a rack for installation in the rack mounting system from the examples of FIGS. 13A and 13B.

FIG. 19 is an isometric view of a portion of compute module rack 108 for installation in the rack mounting system from the examples of FIGS. 13A and 13B. FIG. 19 shows a second liquid manifold 1402 having a plurality of liquid connectors 1404, as well as connections 1900 and 1902 to couple to supply liquid service line 1406 (not shown in FIG. 19) and return liquid service line 1408 (not shown in FIG. 19), respectively. Also shown in FIG. 19 is optical plenum 1600 as well as a connection 1904 to couple to optical connectivity service line 1800 (not shown in FIG. 19). FIG. 19 further shows power distribution unit (PDU) 1700 as well as a connection 1906 to couple to power service line 1602 (not shown in FIG. 19). PDU 1700 includes a plurality of individual power connectors 1907 for connection of individual compute modules in a compute module rack to receive power from power distribution infrastructure 600.

As shown in FIG. 19, compute module rack 108 may be provided with tracks 1908 for engagement with roller assemblies 1302 on rack mounting columns 1300. Further, an extraction handle 1910 may be provided on rack 108 for facilitating extraction of compute module rack 108 from array 106 of compute module racks 108.

Figure 20:
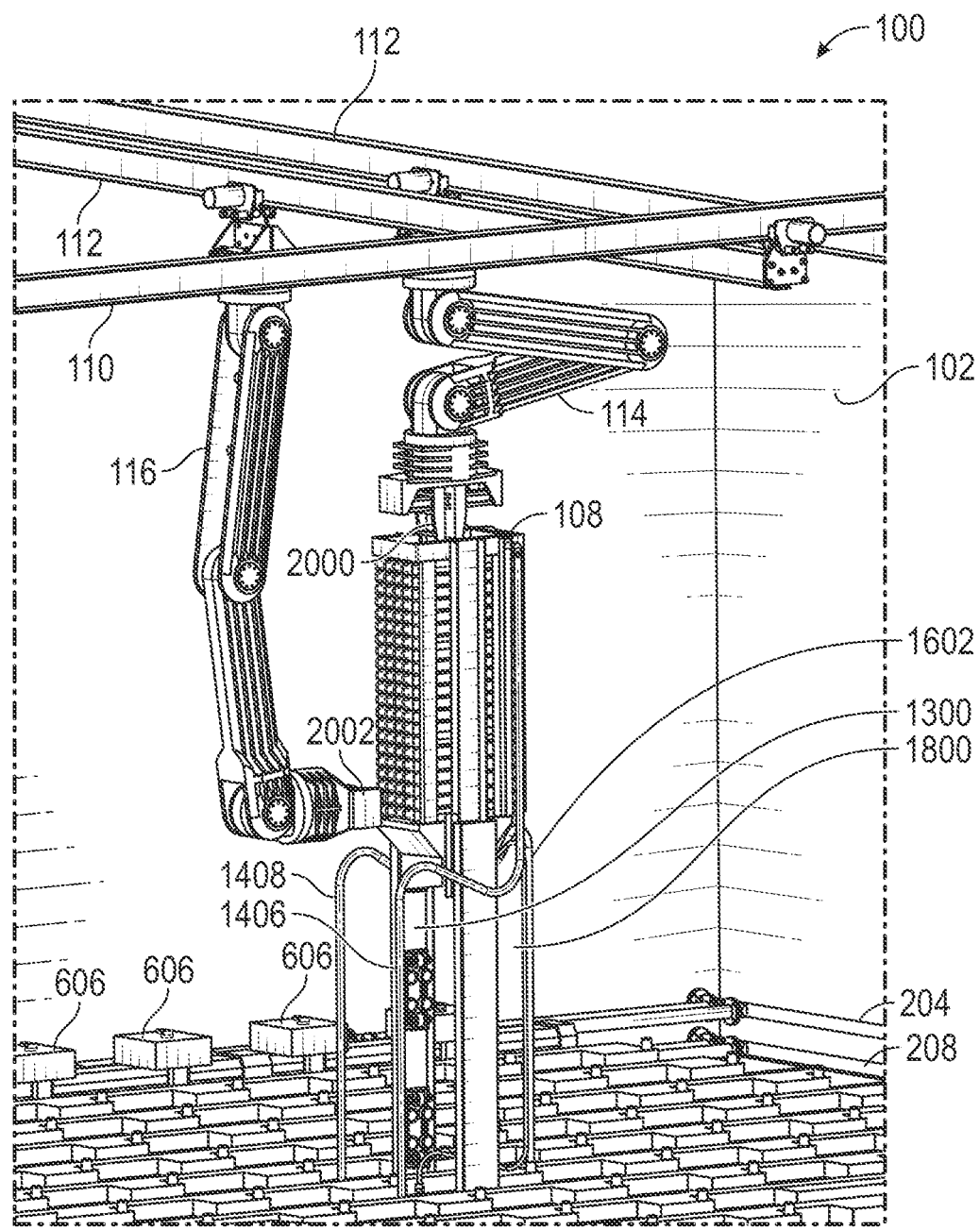
FIG. 20 is an isometric view of a portion of the computing system from FIG. 1 showing a robotic system including a robotic rack accessing mechanism and a robotic compute module accessing system operating on a rack in the computing system.

Referring to FIG. 20. in various examples a first robotic manipulator 114 may be provided for selectively extracting a compute module rack 108 from the array 106 of compute module racks. In some examples, first robotic manipulator may be mobilized to a particular location relative to array 106 of compute module racks 108 by movement of rolling beam 112 along stationary beams 110. FIG. 20 is an isometric view of a portion of computing system 100 from FIG. 1. FIG. 1 shows a single compute module rack 108 having been extracted by first robotic manipulator 114 from rack mounting columns 1300. (For the purposes of illustration, in FIG. 20, only a single compute module rack 108 in the array 106 of compute module racks 108 is shown.

As shown in FIG. 20, first robotic manipulator 114 may include an end effector 2000 for engaging extraction handle 1910 of compute module rack 108. Once extracted from array 106 of compute module racks 108, compute modules contained within compute module rack 108 may then be robotically accessed by second robotic manipulator 116, which cooperates with first robotic manipulator 114 and which may have an end effector 2002 for withdrawing a selected compute module from compute module rack 108.

In various examples, first robotic manipulator 114 and second robotic manipulator 116 may be operated under user control, for example, through computer interface enabling a user to select a compute module rack 108 to be extracted and a compute module within the selected compute module 108 to be accessed.

As shown in FIG. 20, in some examples, the lengths of service lines including supply liquid service line 1406, return liquid service line 1408, power service line 1602, and optical connectivity service line 1800 permit compute module rack 108 to remain coupled to the underlying liquid distribution infrastructure 200, power distribution infrastructure 600, and optical connectivity infrastructure even while compute module rack 108 is withdrawn from rack mounting columns 1300. In some examples, structural supports (not shown) may be provided for the service lines that accommodate the service lines to be safely extended (e.g., with no mechanical stress) when rack is withdrawn from mounting columns, and safely retracted into positions (e.g., with proper bend radii) when rack is inserted back in mounting columns.

While examples herein have been described in terms of an array 106 of compute module racks 108, in other examples, contiguous plane infrastructures such as described herein may be provided for an array of individual compute modules. Individual compute modules may be coupled to a contiguous plane infrastructure according to the examples herein either directly, such as with blind-mate connections, or via liquid, power, and optical service lines such as described in the foregoing examples.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A computing system, comprising:
    an array of compute module racks,
        wherein the array comprises a plurality of rack positions distributed in a horizontal plane,
        wherein each compute module rack contains a plurality of compute modules stacked in a vertical direction within the compute module rack, the vertical direction being perpendicular to the horizontal plane, and
        wherein each compute module rack is configured to be movable in the vertical direction to extract the compute module rack from the array, and each compute module of a given one of the compute module racks is accessible by selectively extracting the given compute module rack out of the array of compute module racks;
    a liquid distribution infrastructure comprising a plurality of liquid coolant supply lines and a plurality of liquid coolant return lines, the liquid coolant supply lines and the liquid coolant return lines arranged in a first plane adjacent to the array of compute module racks and coupled to each of the compute module racks to provide liquid cooling for the plurality of compute module racks, the first plane being parallel to the horizontal plane of the array;
a power distribution infrastructure comprising power supply lines arranged in a second plane adjacent to the array of compute module racks and coupled to each of the compute module racks, the second plane being parallel to the horizontal plane of the array; and
an optical connectivity infrastructure comprising optical fiber cables arranged in a third plane adjacent to the array of compute module racks and coupled to each of the compute module racks, the third plane being parallel to the horizontal plane of the array.

2. The computing system infrastructure of claim 1, wherein each compute module rack remains coupled to the liquid distribution infrastructure, the power distribution infrastructure, and the optical connectivity infrastructure when extracted out of the array.

3. The computing system infrastructure of claim 1, further comprising:
a plurality of pairs of rack mounting columns arranged at the plurality of rack positions, each pair of rack mounting columns configured to support a corresponding compute module rack in the array of compute module racks and to facilitate the movement of the corresponding compute module rack in the vertical direction for selective extraction of the corresponding compute module rack out of the array of compute module racks.

4. The computing system of claim 3, further comprising:
a first robotic manipulator configured to selectively engage the selected compute module rack in the array of compute module racks and extract the selected compute module rack from the array of compute module racks.

5. The computing system of claim 4, further comprising:
a second robotic manipulator configured to selectively engage a compute module in the selected compute module rack that is extracted from the array of compute module racks by the first robotic manipulator.

6. The computing system of claim 2, further comprising:
a plurality of service lines for each compute module rack, wherein the plurality of service lines are configured to maintain connections between each compute module rack and the liquid distribution infrastructure, the power distribution infrastructure, and the optical connectivity infrastructure when each compute module rack is extracted out of the array of compute module racks.

7. A method of configuring a computing system, comprising:
providing an array of compute module racks,
wherein the array comprises a plurality of rack positions distributed in a horizontal plane,
wherein each compute module rack contains a plurality of compute modules stacked in a vertical direction within the compute module rack, the vertical direction being perpendicular to the horizontal plane, and
wherein each compute module rack is configured to be movable in the vertical direction to extract the compute module rack from the array, and each compute module of a given one of the compute module racks is accessible by extraction of the given compute module rack out of the array of compute module racks;
providing a liquid distribution infrastructure comprising liquid coolant supply lines and liquid coolant return lines arranged in a first plane adjacent to the array of compute module racks and coupled to each of the vertical racks to provide liquid cooling for the plurality of compute module racks, the first plane being parallel to the horizontal plane of the array;
providing a power distribution infrastructure comprising power supply lines arranged in a second plane adjacent to the array of compute module racks and coupled to each of the compute module racks, the second plane being parallel to the horizontal plane of the array; and
providing an optical connectivity infrastructure comprising optical fiber cables arranged in a third plane adjacent to the array of compute module racks and coupled to each of the compute module racks, the third plane being parallel to the horizontal plane of the array.

8. The method of claim 7, further comprising:
providing a plurality of pairs of rack mounting columns arranged at the plurality of rack positions, each pair of the rack mounting columns supporting a corresponding compute module rack in the array of compute module racks and facilitating the movement of the corresponding compute module rack in the vertical direction for the selective extraction of the corresponding compute module rack out of the array of compute module racks.

9. The method of claim 7, further comprising:
providing a first robotic manipulator for selectively engaging a selected compute module rack in the array of compute module racks and extracting the selected compute module rack from the array of compute module racks.

10. The method of claim 9, further comprising:
providing a second robotic manipulator for selectively engaging the selected compute module in a compute module rack that is extracted from the array of compute module racks by the first robotic manipulator.

11. The method of claim 8, further comprising:
providing a plurality of service lines for each compute module rack for maintaining connections between each compute module rack and the liquid distribution infrastructure, the power distribution infrastructure, and the optical connectivity infrastructure when each compute module rack is extracted out of the array of compute module racks.

12. The method of claim 7, wherein the liquid distribution infrastructure is divided into a plurality of zones each having a separate liquid supply and liquid return line.

13. A contiguous plane infrastructure for a computing system, comprising:
a liquid distribution infrastructure arranged in a first plane, the liquid distribution infrastructure providing a liquid supply tap and a liquid return tap for each of a plurality of compute module racks disposed in an array of compute module racks adjacent to the first plane, wherein the array comprises a plurality of rack positions distributed in a horizontal plane parallel to the first plane with each of the compute module racks disposed at one of the rack positions and having a longest dimension extending in a vertical direction perpendicular to the horizontal plane;
a power distribution infrastructure arranged in a second plane parallel to and contiguous with the first plane, the power distribution infrastructure providing a power connection receptable for each of the plurality of compute module racks; and
an optical connectivity infrastructure arranged in a third plane parallel to and contiguous with the first plane and the second plane, the optical interconnectivity infrastructure providing an optical connector receptable for each of the plurality of compute module racks, wherein the liquid distribution infrastructure, power distribution infrastructure, and optical connectivity infrastructure are configured to, for each of the compute module racks, permit movement of the compute module rack in the vertical direction to extract the compute module rack from the array.

14. The contiguous plane infrastructure of claim 13, further comprising:
a plurality of pairs of rack mounting columns, each pair of rack mounting columns configured to support a corresponding compute module rack in the array of compute module racks and to facilitate the selective extraction of the corresponding compute module rack out of the array of compute module racks.

15. The contiguous plane infrastructure of claim 13, further comprising:
a first robotic manipulator for configured to selectively engage a selected compute module rack in the array of compute module racks and extract the selected compute module rack from the array of compute module racks.

16. The contiguous plane infrastructure of claim 15, further comprising:
a second robotic manipulator configured to selectively engage the selected compute module rack in a compute module rack that is extracted from the array of compute module racks by the first robotic manipulator.

17. The contiguous plane infrastructure of claim 15, further comprising:
a plurality of service lines for each compute module rack, wherein the plurality of service lines are configured to maintain connections between each compute module rack and the liquid distribution infrastructure, the power distribution infrastructure, and the optical connectivity infrastructure when each compute module rack is extracted out of the array of compute module racks.

18. The computing system of claim 3,
wherein the first robotic manipulator is positioned vertically above the array of compute module racks and is configured to extract a selected compute module rack from the array of compute module racks by lifting the selected compute module rack vertically above the other compute module racks.

19. The method of claim 9,
wherein the first robotic manipulator is positioned vertically above the array of compute module racks and is configured to extract a selected compute module rack from the array of compute module racks by lifting the selected compute module rack vertically above the other compute module racks.

20. The contiguous plane infrastructure of claim 15,
wherein the first robotic manipulator is positioned vertically above the array of compute module racks and is configured to extract a selected compute module rack from the array of compute module racks by lifting the selected compute module rack vertically above the other compute module racks.

* * * * *